(12) United States Patent
Arai et al.

(10) Patent No.: US 8,232,600 B2
(45) Date of Patent: Jul. 31, 2012

(54) SEMICONDUCTOR INTEGRATED CIRCUIT

(75) Inventors: Katsuya Arai, Kyoto (JP); Toshihiro Kougami, Kyoto (JP); Hiroaki Yabu, Kyoto (JP)

(73) Assignee: Panasonic Corporation, Osaka (JP)

( * ) Notice: Subject to any disclaimer, the term of this patent is extended or adjusted under 35 U.S.C. 154(b) by 168 days.

(21) Appl. No.: 12/710,762

(22) Filed: Feb. 23, 2010

(65) Prior Publication Data
US 2010/0148267 A1  Jun. 17, 2010

Related U.S. Application Data

(63) Continuation of application No. PCT/JP2009/003136, filed on Jul. 6, 2009.

(30) Foreign Application Priority Data

Sep. 25, 2008  (JP) .................................. 2008-246242

(51) Int. Cl.
H01L 23/62  (2006.01)
(52) U.S. Cl. .................................. 257/355; 257/E27.06
(58) Field of Classification Search .................. 257/355, 257/360, E27.06
See application file for complete search history.

(56) References Cited

U.S. PATENT DOCUMENTS

| | | | |
|---|---|---|---|
| 5,442,217 A | 8/1995 | Mimoto | |
| 5,847,429 A * | 12/1998 | Lien et al. | 257/355 |
| 5,977,594 A | 11/1999 | Takao | |
| 6,469,354 B1 | 10/2002 | Hirata | |
| 6,611,025 B2 * | 8/2003 | Lin | 257/355 |
| 6,768,201 B1 | 7/2004 | Imade et al. | |
| 6,815,775 B2 * | 11/2004 | Ker et al. | 257/355 |
| 7,354,813 B2 | 4/2008 | Kwon et al. | |
| 7,705,404 B2 * | 4/2010 | Ker et al. | 257/360 |
| 7,932,561 B2 | 4/2011 | Kakiuchi | |
| 2003/0058027 A1 | 3/2003 | Kwon et al. | |
| 2004/0051146 A1 * | 3/2004 | Ker et al. | 257/356 |
| 2004/0178453 A1 * | 9/2004 | Duvvury et al. | 257/355 |
| 2005/0205928 A1 | 9/2005 | Kwon et al. | |
| 2005/0275032 A1 | 12/2005 | Kodama et al. | |
| 2006/0033163 A1 * | 2/2006 | Chen | 257/355 |
| 2006/0091465 A1 * | 5/2006 | Chen | 257/360 |
| 2007/0211399 A1 | 9/2007 | Kakiuchi | |

FOREIGN PATENT DOCUMENTS

| | | |
|---|---|---|
| JP | 06-104721 | 4/1994 |
| JP | 2008-205772 | 9/2008 |

* cited by examiner

*Primary Examiner* — Allan R Wilson
(74) *Attorney, Agent, or Firm* — McDermott Will & Emery LLP

(57) ABSTRACT

A semiconductor integrated circuit includes: a well 35 of a first conductivity type formed on a substrate 37; a first external terminal 10, a second external terminal 11, and a third external terminal 12 provided above the substrate 37; a first protection circuit 20 provided on an electrical path between the first external terminal 10 and the second external terminal 11; a second protection circuit 21 provided on an electrical path between the second external terminal 11 and the third external terminal 12; and a third protection circuit 22 provided on an electrical path between the third external terminal 12 and the first external terminal 10. A guard ring 40 is formed continuously in the well to surround at least two circuits among the first, second, and third protection circuits 20, 21, and 22, formed on the well 35.

7 Claims, 4 Drawing Sheets

SEMICONDUCTOR INTEGRATED CIRCUIT

CROSS-REFERENCE TO RELATED APPLICATION

This is a continuation of PCT International Application PCT/JP2009/003136 filed on Jul. 6, 2009, which claims priority to Japanese Patent Application No. 2008-246242 filed on Sep. 25, 2008. The disclosures of these applications including the specifications, the drawings, and the claims are hereby incorporated by reference in its entirety.

BACKGROUND

The present disclosure relates to a semiconductor integrated circuit provided with an electrostatic discharge (ESD) protection device.

In recent years, semiconductor integrated circuits have been increasingly enhanced in the scale of integration in parallel with implementation of finer and higher-density devices, and hence have become susceptible to damages caused by electrostatic discharge (hereinafter, referred to as a "surge"). For example, the possibility has increased that devices such as input circuits, output circuits, input/output circuits, and internal circuits may be broken due to surges entering via pads for external connection (external pads), degrading the performance of the devices. For this reason, semiconductor integrated circuits are provided with ESD protection devices that are placed between external pads and any of input circuits, output circuits, input/output circuits, and internal circuits, for protection of such circuits against surges.

Also, in a semiconductor integrated circuit, with increase in the number of circuit blocks for higher functionality and with decrease in power consumption, the number of different power supplies used in the semiconductor integrated circuit has been sharply increasing. Signals are transferred between circuit blocks that use different power supplies in the semiconductor integrated circuit. Hence, to prevent surge-caused breakage of circuit portions responsible for transfer of signals between circuit blocks that use different power supplies, an ESD protection circuit must be provided between different power supplies. The relationship between the number of different power supplies and the number of ESD protection circuits (theoretical value) required to be placed is expressed by N=P×(P−1)÷2. For example, when the number of different power supplies is 20, 190 ESD protection circuits are required.

However, since ESD protection circuits do not function at all during normal operation of a semiconductor integrated circuit, it is strongly desired to reduce the area of the ESD protection circuits as much as possible to reduce the cost of the semiconductor integrated circuit.

FIG. 5 is a view showing a circuit configuration of a conventional ESD protection device including a plurality of ESD protection circuits, and FIG. 6 is a view showing a layout (upper part) and cross section (lower part) of the conventional ESD protection device. FIG. 5 is shown in Japanese Patent Publication No. H06-104721. As shown in FIG. 5, the conventional ESD protection device includes a first protection circuit 200 placed between a first external terminal 100 and a second external terminal 101, a second protection circuit 201 placed between the second external terminal 101 and a third external terminal 102, and a third protection circuit 202 placed between the third external terminal 102 and the first external terminal 100. The first, second, and third protection circuits 200, 201, and 202 are each constructed of an N-channel MOS transistor (hereinafter, referred to as an NMOS transistor). The first, second, and third external terminals 100, 101, and 102 receive power supply voltages different from one another.

As shown in FIG. 6, the first, second, and third protection circuits 200, 201, and 202 are all formed on a p-type well 122 that is formed on a semiconductor substrate 120. Element isolation regions 110 constructed of shallow trench isolation (STI) and the like respectively surround the first, second, and third protection circuits 200, 201, and 202 individually. Also, guard rings 400, 401, 402 respectively surround the first, second, and third protection circuits 200, 201, and 202 individually. The guard rings 400, 401, and 402 are formed in an upper portion of the p-type well 122 and include a p-type impurity at a density higher than the p-type well 122.

If a surge enters from the first external terminal 100, the charge of the surge is released to the second external terminal 101 via the first protection circuit 200 and to the third external terminal 102 via the third protection circuit 202. Likewise, if a surge enters from the second external terminal 101, the charge of the surge is released to the first external terminal 100 via the first protection circuit 200 and to the third external terminal 102 via the second protection circuit 201. If a surge enters from the third external terminal 102, the charge of the surge is released to the second external terminal 101 via the second protection circuit 201 and to the first external terminal 100 via the third protection circuit 202.

With the configuration and operation as described above, the conventional ESD protection device can protect circuits to be protected such as input circuits, output circuits, input/output circuits, and internal circuits.

SUMMARY

However, in a semiconductor integrated circuit, with the recent increase in the number of circuit blocks for higher functionality and with decrease in power consumption, the number of different power supplies used in the semiconductor integrated circuit has been sharply increasing. To reduce the cost of the semiconductor integrated circuit, therefore, it is strongly desired to reduce the area of the ESD protection circuit provided for each power supply.

In the conventional ESD protection device shown in FIG. 6, in which the first, second, and third protection circuits 200, 201, and 202 are individually surrounded by the guard rings 400, 401, and 402, respectively, the areas required for the guard rings themselves and the space between every adjacent guard rings are large. As a result, in the conventional configuration, a semiconductor integrated circuit having a larger number of different power supplies will need a larger area to be occupied by ESD protection devices.

It is an object of the present invention to provide a semiconductor integrated circuit having ESD protection devices with which increase in the area of the semiconductor integrated circuit can be reduced even when the number of different power supplies increases.

To attain the above object, the semiconductor integrated circuit of the present invention includes: a well of a first conductivity type formed on a semiconductor substrate; a first external terminal, a second external terminal, and a third external terminal provided above the semiconductor substrate; a first protection circuit formed in a first region of the well, having a first impurity diffusion region and a second impurity diffusion region that are both of a second conductivity type and electrically connected to the first external terminal and the second external terminal, respectively; a second protection circuit formed in a second region of the well, having a third impurity diffusion region and a fourth impurity diffusion region that are both of the second conductivity type and electrically connected to the second external terminal and the third external terminal, respectively; a third protection circuit formed in a third region of the well, having a fifth impurity diffusion region and a sixth impurity diffusion region that are both of the second conductivity type and electrically connected to the third external terminal and the first external terminal, respectively; an element isolation region formed in the well to surround the first region, the second region, and the third region; and a guard ring formed continuously in the well to surround at least two regions adjacent to each other, among the first region, the second region, and the third region, via the element isolation region.

With the above configuration, since the guard ring formed continuously in the well surrounds a plurality of regions in which protection circuits are provided, the area of the entire protection circuits can be greatly reduced compared with the case that guard rings individually surround a plurality of regions in which protection circuits are provided. Hence, even when the number of different power supplies supplied to an integrated circuit increases, for example, increase in the area of the entire protection circuits can be suppressed. In the meantime, since the guard ring surrounds the protection circuits, the function of the guard ring, such as stabilization of the well potential, is maintained, as in the conventional semiconductor integrated circuit.

A protection circuit is preferably provided between two external terminals to which power supply voltages (including the ground voltage) are supplied, as shown in the circuit diagram, but may otherwise be connected to a terminal to which no power supply voltage is supplied.

According to the semiconductor integrated circuit of an example of the present invention, a continuously formed guard ring surrounds at least two protection circuits adjacent to each other. Hence, the region located between the protection circuits can be reduced compared with the case of the conventional semiconductor integrated circuit.

DETAILED DESCRIPTION

Embodiments of the present invention will be described with reference to the drawings.

(Embodiment) 1

Figure 1:
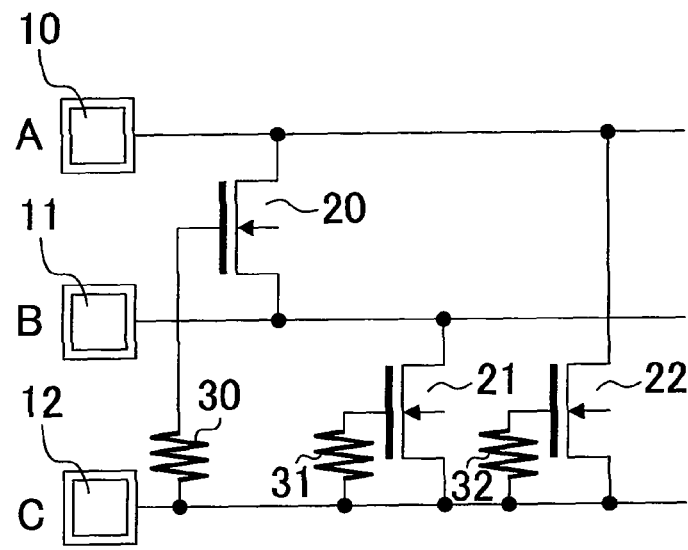
FIG. 1 is a view showing a circuit configuration of an ESD protection device in a semiconductor integrated circuit of Embodiment 1 of the present invention.
Figure 2:
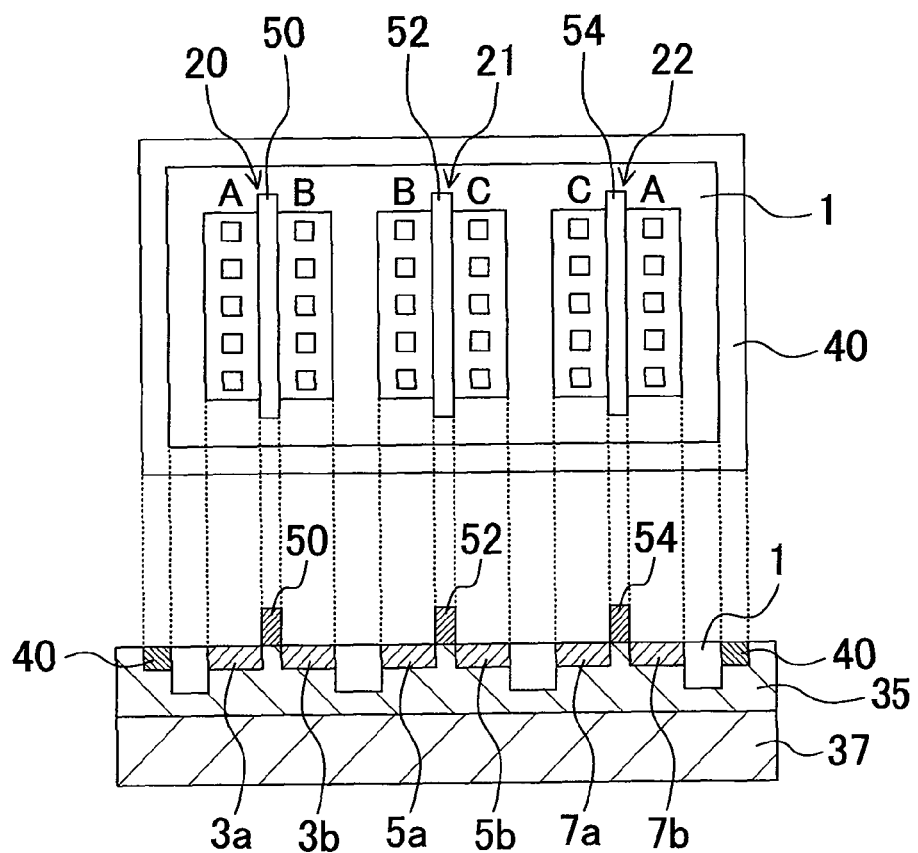
FIG. 2 is a view showing a layout (upper part) and cross section (lower part) of the ESD protection device in the semiconductor integrated circuit of Embodiment 1.

FIG. 1 is a view showing a circuit configuration of an ESD protection device in a semiconductor integrated circuit of Embodiment 1 of the present invention, and FIG. 2 is a view showing a layout (upper part) and cross section (lower part) of the ESD protection device in the semiconductor integrated circuit of Embodiment 1. In the semiconductor integrated circuit of this embodiment, the layout of the ESD protection device is different from the conventional one.

As shown in FIG. 1, the semiconductor integrated circuit of this embodiment includes a first external terminal 10, a second external terminal 11, a third external terminal 12, and circuits to be protected (not shown) that receive signals and power supply voltages via first, second, and third external terminals 10, 11, and 12. Examples of the circuits to be protected include input circuits, output circuits, input/output circuits, internal circuits, and the like. The semiconductor integrated circuit of this embodiment also includes a first protection circuit 20 placed between the first external terminal 10 and the second external circuit 11, a second protection circuit 21 placed between the second external terminal 11 and the third external circuit 12, and a third protection circuit 22 placed between the third external terminal 12 and the first external circuit 10, as shown in the circuit diagram. In the example illustrated in FIG. 1, power supply voltages different from one another are supplied to the first, second, and third external terminals 10, 11, and 12. The first protection circuit 20, the second protection circuit 21, and the third protection circuit 22 are constructed of NMOS transistors having a first gate electrode 50, a second gate electrode 52, and a third gate electrode 54, respectively, and the first, second, and third gate electrodes 50, 52, and 54 are connected to an external terminal, among the first, second, and third external terminals 10, 11, and 12, to which the lowest voltage is supplied (in the illustrated example, the third external terminal 12). With this configuration, the MOS transistors constituting the first, second, and third protection circuits 20, 21, and 22 are off during normal operation of the semiconductor integrated circuit.

When required, resistances 30, 31, and 32 may be provided between the first, second, and third gate electrodes 50, 52, and 54 of the first, second, and third protection circuits 20, 21, and 22 and the external terminal connected to these gate electrodes, respectively. The resistances 30, 31, and 32 can be easily formed from polysilicon and the like formed on the semiconductor substrate.

Next, the layout of the ESD protection device in this embodiment will be described.

As shown in FIG. 2, the ESD protection device in this embodiment includes: a p-type (first conductivity type) well 35 formed on a semiconductor substrate 37; an element isolation region 1 surrounding a first region, a second region, and a third region formed in the well 35 individually; and a guard ring 40 higher in p-type impurity density than the well 35, formed in an upper portion of the well 35 to surround the entire of the first, second, and third regions via the element isolation region 1. In the first region of the well 35, formed is the first protection circuit 20 constructed of an NMOS transistor that has an n-type first impurity diffusion region 3a, an n-type second impurity diffusion region 3b, and the first gate electrode 50 formed on a portion of the well 35 located between the first and second impurity diffusion regions 3a and 3b via a gate insulating film (not shown). In the second region, formed is the second protection circuit 21 constructed of an NMOS transistor that has an n-type third impurity diffusion region 5a, an n-type fourth impurity diffusion region 5b, and the second gate electrode 52 formed on a portion of the well 35 located between the third and fourth impurity diffusion regions 5a and 5b via the gate insulating film (not shown). In the third region, formed is the third protection circuit 22 constructed of an NMOS transistor that has an n-type fifth impurity diffusion region 7a, an n-type sixth impurity diffusion region 7b, and the third gate electrode 54 formed on a portion of the well 35 located between the fifth and sixth impurity diffusion regions 7a and 7b via the gate insulating film (not shown). The first, second, and third external terminals 10, 11, and 12 are formed above the semiconductor substrate 37. The first external terminal 10 is connected to the first impurity diffusion region 3a and the sixth impurity diffusion region 7b, the second external terminal 11 is connected to the second impurity diffusion region 3b and the third impurity diffusion region 5a, and the third external terminal 12 is connected to the fourth impurity diffusion region 5b and the fifth impurity diffusion region 7a. In other words, the external terminals denoted by A, B, and C shown in FIG. 1 are respectively connected to the impurity diffusion regions denoted by A, B, and C shown in the layout (upper part) of the ESD protection device in FIG. 2.

In the semiconductor integrated circuit of this embodiment, the element isolation region 1 surrounds the first, second, and third regions of the well 35 individually, and the guard ring 40 formed continuously in the well 35 surrounds the entire of the first, second, and third regions via the element isolation region 1.

With the configuration described above, although the circuit configuration of the ESD protection device is the same as the conventional one, the area can be reduced compared with the conventional semiconductor integrated circuit. In the semiconductor integrated circuit of this embodiment, in which the guard ring 40 surrounds the entire of the plurality of protection circuits (the first, second, and third regions), the area can be reduced, compared with the conventional case of providing guard rings for respective protection circuits, by the width of portions of the guard rings located between the adjacent protection circuits. Also, the width of portions of the element isolation region required between the adjacent protection circuits can be reduced compared with the conventional semiconductor integrated circuit. As a result, the area of the ESD protection device can be greatly reduced. The guard ring 40 is provided to fix the potential of the well 35 at the ground potential or the like for suppressing occurrence of latch-up. Since the guard ring 40 surrounds the entire of the first, second, and third protection circuits 20, 21, and 22 in this embodiment, the effect of the guard ring of suppressing fluctuation of the well potential is the same as that obtained in the conventional semiconductor integrated circuit in which the guard rings surround the protection circuits individually. Accordingly, in the semiconductor integrated circuit of this embodiment, even when the number of different power supply voltages increases for purposes such as increasing the number of circuit blocks and reducing the power consumption, increase in the circuit area of the ESD protection device can be suppressed, and hence increase in the area of the entire circuit can be suppressed.

Next, the circuit operation in the semiconductor integrated circuit of this embodiment observed when a surge current has entered will be described.

When a surge of positive charge is applied to the first external terminal 10 while the third external terminal 12 is grounded, a parasitic NPN bipolar transistor in the NMOS transistor constituting the third protection circuit 22 operates and releases the surge current to the third external terminal 12. When a surge of negative charge is applied to the first external terminal 10 while the third external terminal 12 is grounded, a parasitic diode transistor in the NMOS transistor constituting the third protection circuit 22 operates and releases the surge current to the first external terminal 10.

When a surge of positive charge is applied to the second external terminal 11 while the third external terminal 12 is grounded, a parasitic NPN bipolar transistor in the NMOS transistor constituting the second protection circuit 21 operates and releases the surge current to the third external terminal 12. When a surge of negative charge is applied to the second external terminal 11 while the third external terminal 12 is grounded, a parasitic diode transistor in the NMOS transistor constituting the second protection circuit 21 operates and releases the surge current to the second external terminal 11.

When a surge of positive charge is applied to the first external terminal 10 while the second external terminal 11 is grounded, a parasitic NPN bipolar transistor in the NMOS transistor constituting the first protection circuit 20 operates and releases the surge current to the second external terminal 11. When a surge of negative charge is applied to the first external terminal 10 while the second external terminal 11 is grounded, a parasitic NPN bipolar transistor in the NMOS transistor constituting the first protection circuit 20 operates and releases the surge current to the first external terminal 10.

When a surge of positive charge is applied to the third external terminal 12 while the second external terminal 11 is grounded, a parasitic diode transistor in the NMOS transistor constituting the second protection circuit 21 operates and releases the surge current to the second external terminal 11. When a surge of negative charge is applied to the third external terminal 12 while the second external terminal 11 is grounded, a parasitic NPN bipolar transistor in the NMOS transistor constituting the second protection circuit 21 operates and releases the surge current to the third external terminal 12.

When a surge of positive charge is applied to the second external terminal 11 while the first external terminal 10 is grounded, a parasitic NPN bipolar transistor in the NMOS transistor constituting the first protection circuit 20 operates and releases the surge current to the first external terminal 10. When a surge of negative charge is applied to the second external terminal 11 while the first external terminal 10 is grounded, a parasitic NPN bipolar transistor in the NMOS transistor constituting the first protection circuit 20 operates and releases the surge current to the second external terminal 11.

When a surge of positive charge is applied to the third external terminal 12 while the first external terminal 10 is grounded, a parasitic diode transistor in the NMOS transistor constituting the third protection circuit 22 operates and releases the surge current to the first external terminal 10. When a surge of negative charge is applied to the third external terminal 12 while the first external terminal 10 is grounded, a parasitic NPN bipolar transistor in the NMOS transistor constituting the third protection circuit 20 operates and releases the surge current to the third external terminal 12. With the operation described above, the ESD protection device in this embodiment can protect circuits in the semiconductor integrated circuit from surges.

The resistances 30, 31, and 32 are not essential for the ESD protection device. However, by appropriately adjusting the resistance values of the resistances 30, 31, and 32, the parasitic NPN bipolar transistors in the NMOS transistors constituting the first, second, and third protection circuits 20, 21, and 22 can operate at a lower voltage, and hence circuits to be protected, such as input circuits, output circuits, input/output circuits, and internal circuits in the semiconductor integrated circuit can be protected more reliably.

As described above, the area of the ESD protection device in this embodiment greatly decreases compared with the conventional ESD protection device although the capability thereof of protecting internal circuits and the like from surges is similar to that of the conventional one. Hence, in the ESD protection device in this embodiment, even when the number of different power supply voltages increases, increase in the area required for the ESD protection device can be suppressed, and this can contribute to reduction in the area of the entire semiconductor integrated circuit.

In the ESD protection device in this embodiment, the ESD protection effect can also be obtained even when a power supply voltage is not applied to all of the first, second, and third external terminals 10, 11, and 12.

In the ESD protection device in this embodiment, the gate electrodes of the first, second, and third protection circuits 20, 21, and 22 may be connected to an external terminal, among the first, second, and third external terminals 10, 11, and 12, to which the highest voltage is supplied, and the first, second, and third protection circuits 20, 21, and 22 each may be constructed of a PMOS transistor.

In the example shown in FIG. 2, the guard ring 40 formed continuously in the well 35 surrounds the entire of the three protection circuits. Alternatively, if only the guard ring surrounds at least two adjacent protection circuits, the area can be reduced compared with the conventional ESD protection device. In this case, another guard ring may be provided for a protection circuit that is not surrounded by the guard ring 40.

Although three protection circuits are shown in FIGS. 1 and 2, the number of protection circuits is not limited to this. Assuming that P external terminals to which P different power supply voltages electrically independent of one another are supplied are provided (P is an integer equal to or more than 3), the total number N of protection circuits provided between every combination of two external terminals from the P external terminals is expressed by N=P (P−1)/2. The guard ring 40 may surround the entire N protection circuits.

The element isolation region 1 may be constructed of STI, or may be formed by a LOCOS method.

(Embodiment) 2

Figure 3:
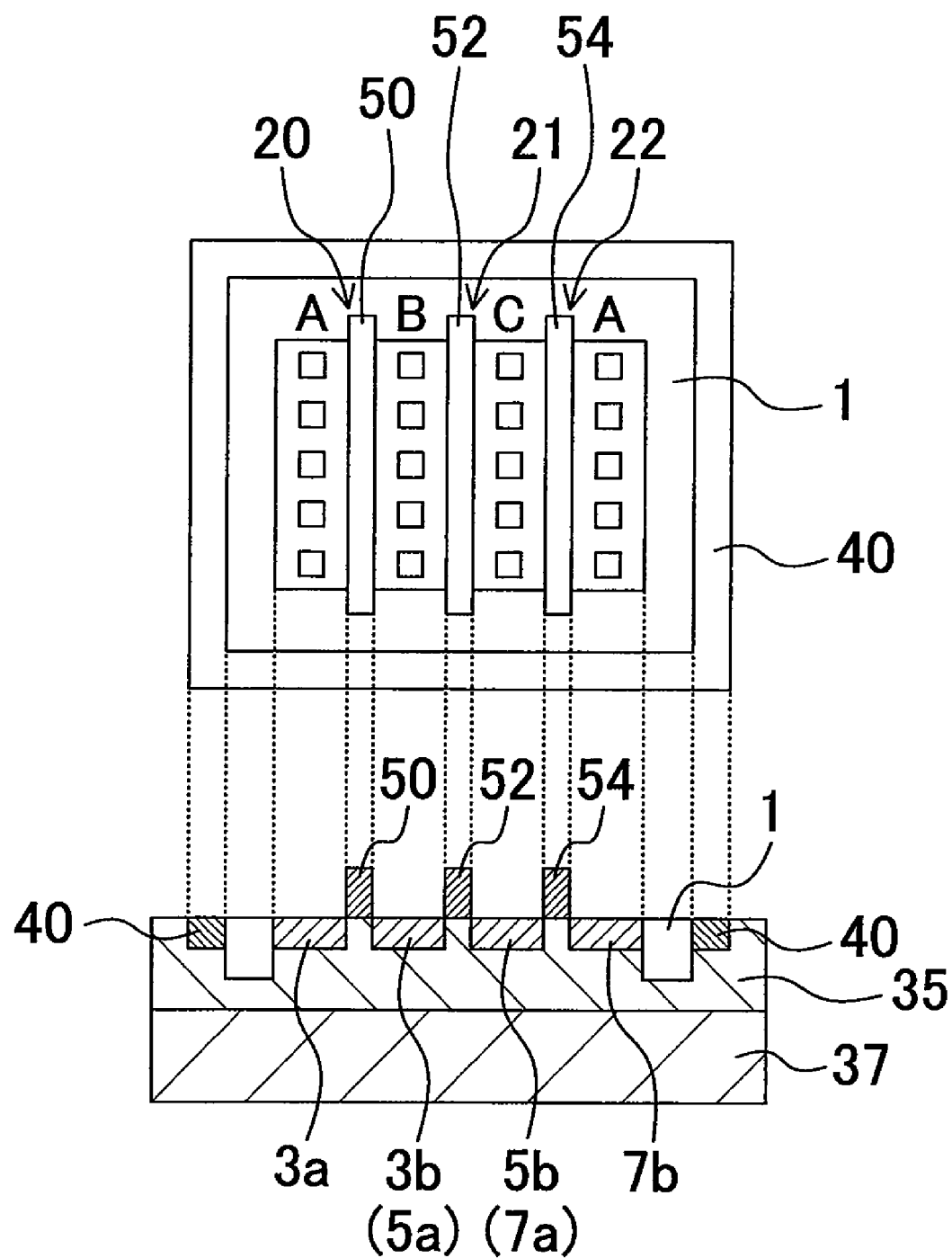
FIG. 3 is a view showing a layout (upper part) and cross section (lower part) of an ESD protection device in a semiconductor integrated circuit of Embodiment 2.

FIG. 3 is a view showing a layout (upper part) and cross section (lower part) of an ESD protection device in a semiconductor integrated circuit of Embodiment 2 of the present invention. The circuit configuration of the ESD protection device in this embodiment is the same as the ESD protection device in Embodiment 1. In this embodiment, therefore, the layout of the ESD protection device will be described in detail.

As shown in FIG. 3, the ESD protection device in this embodiment includes: a p-type (first conductivity type) well 35 formed on a semiconductor substrate 37; an element isolation region 1 surrounding the entire of a first region, a second region, and a third region formed in the well 35; and a guard ring 40 formed in an upper portion of the well 35. In the first region of the well 35, formed is a first protection circuit 20 constructed of a MOS transistor that has an n-type first impurity diffusion region 3a, an n-type second impurity diffusion region 3b, and a first gate electrode 50 formed on a portion of the well 35 located between the first and second impurity diffusion regions 3a and 3b via a gate insulating film (not shown). In the second region, formed is a second protection circuit 21 constructed of a MOS transistor that has an n-type third impurity diffusion region 5a, an n-type fourth impurity diffusion region 5b, and a second gate electrode 52 formed on a portion of the well 35 located between the third and fourth impurity diffusion regions 5a and 5b via the gate insulating film (not shown). In the third region, formed is a third protection circuit 22 constructed of a MOS transistor that has an n-type fifth impurity diffusion region 7a, an n-type sixth impurity diffusion region 7b, and a third gate electrode 54 formed on a portion of the well 35 located between the fifth and sixth impurity diffusion regions 7a and 7b via the gate insulating film (not shown).

The ESD protection device in this embodiment is different from the ESD protection device in Embodiment 1 in that the first region and the second region overlap each other and the second region and the third region overlap each other. Specifically, the second impurity diffusion region 3b and the third impurity diffusion region 5a share the same region (overlap portion of the first and second regions) in the well 35, and the fourth impurity diffusion region 5b and the fifth impurity diffusion region 7a share the same region (overlap portion of the second and third regions) in the well 35. Hence, unlike Embodiment 1, the first, second, and third regions are not individually surrounded by the element isolation region 1, but are surrounded as an integrated region.

The first external terminal 10 is connected to the first impurity diffusion region 3a and the sixth impurity diffusion region 7b, the second external terminal 11 is connected to the second impurity diffusion region 3b and the third impurity diffusion region 5a via a common contact, and the third external terminal 12 is connected to the fourth impurity diffusion region 5b and the fifth impurity diffusion region 7a via a common contact. In other words, the external terminals denoted by A, B, and C shown in FIG. 1 are respectively connected to the impurity diffusion regions denoted by A, B, and C shown in the layout (upper part) of the ESD protection device in FIG. 3.

The guard ring 40 formed continuously in the well 35 surrounds the entire of the first, second, and third regions via the element isolation region 1.

The first, second, and third gate electrodes 50, 52, and 54 are connected to an external terminal to which the lowest voltage is supplied (in the illustrated example, the third external terminal 12). Hence, the NMOS transistors constituting the first, second, and third protection circuits 20, 21, and 22 are off during normal operation of the semiconductor integrated circuit.

When a surge enters via an external terminal, the semiconductor integrated circuit of this embodiment operates similarly to the semiconductor integrated circuit of Embodiment 1.

The resistances 30, 31, and 32 are not essential for the ESD protection device. However, by appropriately adjusting the resistance values of the resistances 30, 31, and 32, parasitic NPN bipolar transistors of the NMOS transistors constituting the first, second, and third protection circuits 20, 21, and 22 can operate at a lower voltage, and hence circuits to be protected, such as input circuits, output circuits, input/output circuits, and internal circuits in the semiconductor integrated circuit, can be protected more reliably.

As described above, by forming the second impurity diffusion region 3b and the third impurity diffusion region 5a as a common region and the fourth impurity diffusion region 5b and the fifth impurity diffusion region 7a as a common region, it is unnecessary to secure space between the second impurity diffusion region 3b and the third impurity diffusion region 5a and between the fourth impurity diffusion region 5b and the fifth impurity diffusion region 7a. Also, the area can be reduced by the width of two impurity diffusion regions. Hence, in the ESD protection device in this embodiment, while the protection capability against surges is equal to or higher than that of the conventional ESD protection device, the circuit area can be made smaller than that of the ESD protection device in Embodiment 1. Once a surge enters via an external terminal, a surge current may flow via a plurality of other protection devices. In such an event, the semiconductor integrated circuit of this embodiment can easily let the surge current escape via a plurality of protection devices compared with the semiconductor integrated circuit of Embodiment 1. Hence, the protection capability against surges can be further improved.

In the ESD protection device in this embodiment, the gate electrodes of the first, second, and third protection circuits 20, 21, and 22 may be connected to an external terminal, among the first, second, and third external terminals 10, 11, and 12, to which the highest voltage is supplied, and the first, second, and third protection circuits 20, 21, and 22 each may be constructed of a PMOS transistor.

(Embodiment) 3

Figure 4:
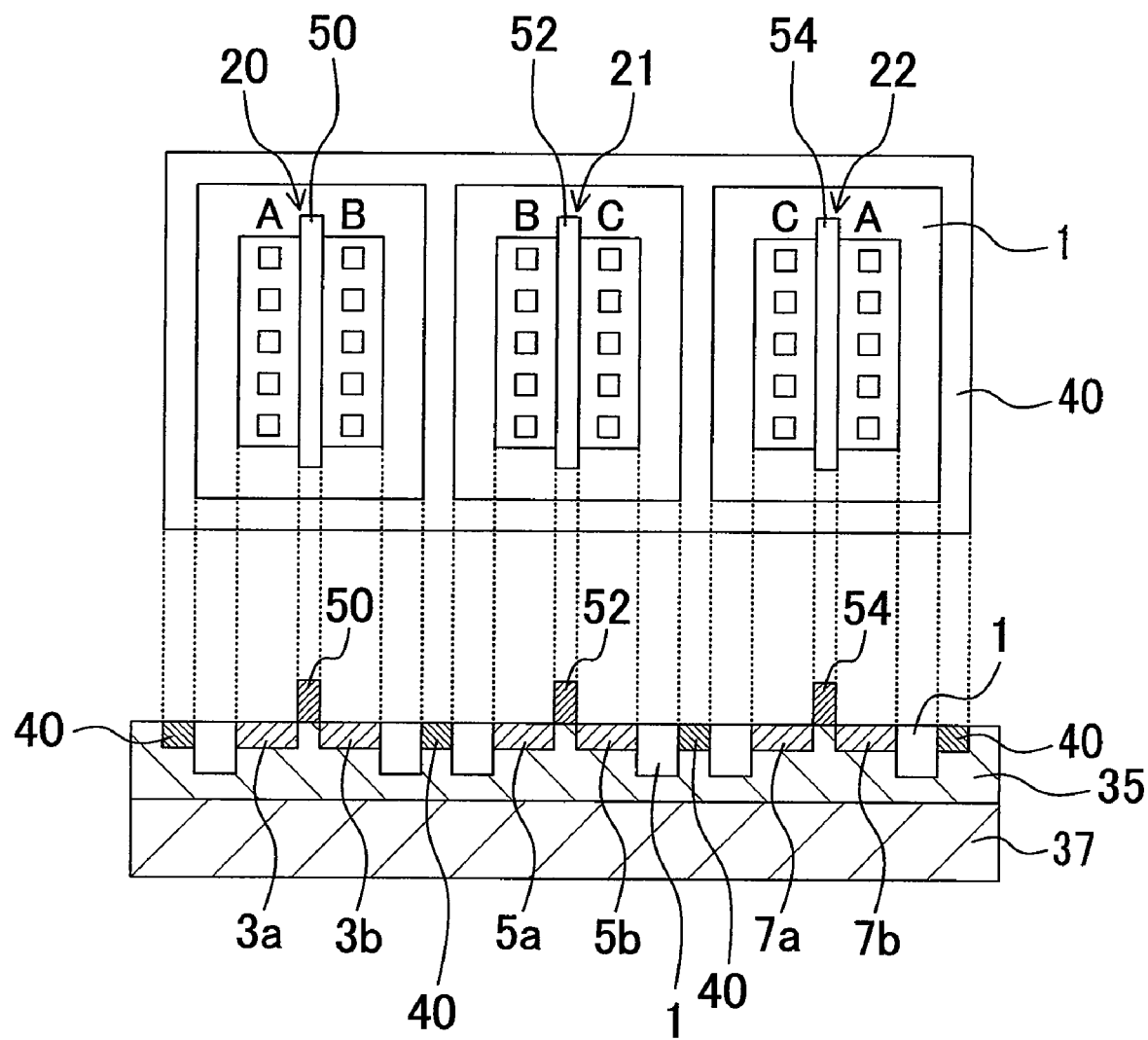
FIG. 4 is a view showing a layout (upper part) and cross section (lower part) of an ESD protection device in a semiconductor integrated circuit of Embodiment 3.
Figure 5:
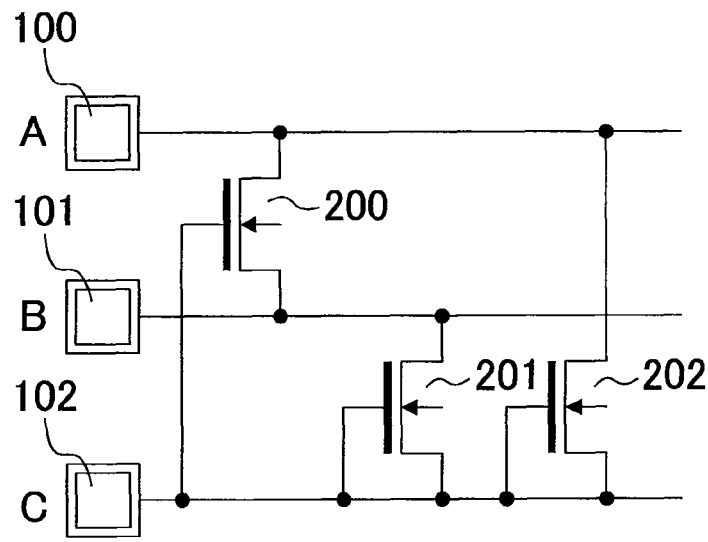
FIG. 5 is a view showing a circuit configuration of a conventional ESD protection device including a plurality of ESD protection circuits.
Figure 6:
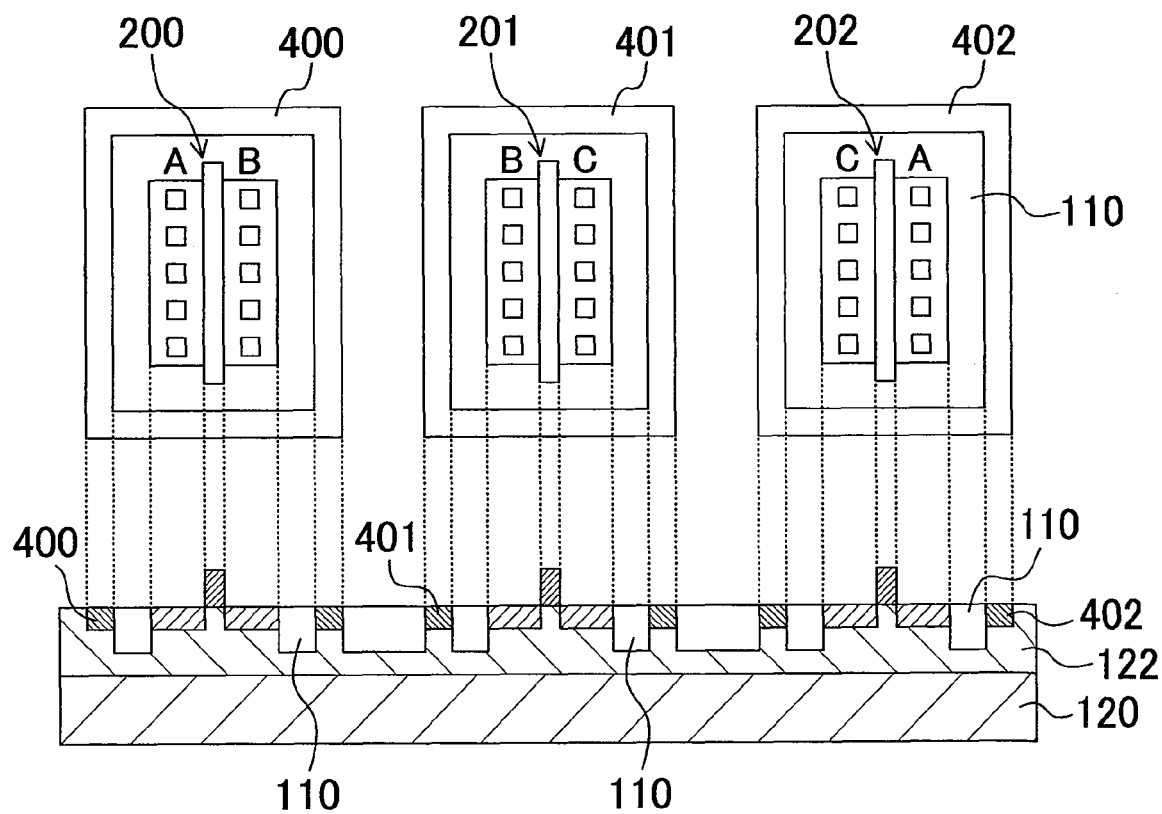
FIG. 6 is a view showing a layout (upper part) and cross section (lower part) of the conventional ESD protection device.

FIG. 4 is a view showing a layout (upper part) and cross section (lower part) of an ESD protection device in a semiconductor integrated circuit of Embodiment 3 of the present invention. The circuit configuration of the ESD protection device in this embodiment is the same as the ESD protection device in Embodiment 1. In this embodiment, therefore, the layout of the ESD protection device will be described in detail.

As shown in FIG. 4, the ESD protection device in this embodiment includes: a p-type (first conductivity type) well 35 formed on a semiconductor substrate 37; element isolation regions 1 respectively surrounding a first region, a second region, and a third region formed in the well 35 individually; and a guard ring 40 formed in an upper portion of the well 35 to surround the first, second, and third regions individually. Note that portions of the guard ring located between the first region and the second region and between the second region and the third region respectively serve as common guard ring portions formed in the same regions. In the first region of the well 35, formed is a first protection circuit 20 constructed of a MOS transistor that has an n-type first impurity diffusion region 3a, an n-type second impurity diffusion region 3b, and a first gate electrode 50 formed on a portion of the well 35 located between the first and second impurity diffusion regions 3a and 3b via a gate insulating film (not shown). In the second region, formed is a second protection circuit 21 constructed of a MOS transistor that has an n-type third impurity diffusion region 5a, an n-type fourth impurity diffusion region 5b, and a second gate electrode 52 formed on a portion of the well 35 located between the third and fourth impurity diffusion regions 5a and 5b via the gate insulating film (not shown). In the third region, formed is a third protection circuit 22 constructed of a MOS transistor that has an n-type fifth impurity diffusion region 7a, an n-type sixth impurity diffusion region 7b, and a third gate electrode 54 formed on a portion of the well 35 located between the fifth and sixth impurity diffusion regions 7a and 7b via the gate insulating film (not shown). The element isolation regions 1 electrically isolate the first, second, third regions from one another by surrounding these regions individually, as in the semiconductor integrated circuit of Embodiment 1.

In the ESD protection device in this embodiment, the guard ring 40 formed continuously in the well 35 surrounds the entire of the first, second, and third regions via the element isolation regions 1. The guard ring 40 is also formed continuously in portions of the well 35 located between the first region and the second region and between the second region and the third region.

With the configuration described above, in which the guard ring 40 surrounds the first, second, and third regions in which the protection circuits are formed individually as viewed from top, the effect of suppressing fluctuation of the potential of the well 35 is very high. Also, since portions of the guard ring 40 located between the first region and the second region and between the second region and the third region respectively serve as common guard ring portions formed in the same regions, the area can be greatly reduced compared with the conventional ESD protection device in which guard rings are separately provided in the well to surround the protection circuits.

Although three protection circuits are shown in FIG. 4, four or more protection circuits may be provided and surrounded by the guard ring 40 formed continuously.

The ESD protection device according to the present invention is useful in suppressing increase in the area of a semiconductor integrated circuit that uses a large number of different power supplies, for example.

What is claimed is:

1. A semiconductor integrated circuit, comprising:
a well of a first conductivity type formed on a semiconductor substrate;
a first external terminal, a second external terminal, and a third external terminal provided above the semiconductor substrate;
a first protection circuit formed in a first region of the well, having a first impurity diffusion region and a second impurity diffusion region that are both of a second conductivity type and electrically connected to the first external terminal and the second external terminal, respectively;
a second protection circuit formed in a second region of the well, having a third impurity diffusion region and a fourth impurity diffusion region that are both of the second conductivity type and electrically connected to the second external terminal and the third external terminal, respectively;
a third protection circuit formed in a third region of the well, having a fifth impurity diffusion region and a sixth impurity diffusion region that are both of the second conductivity type and electrically connected to the third external terminal and the first external terminal, respectively;
an element isolation region formed in the well to surround the first region, the second region, and the third region; and
a guard ring formed continuously in the well to surround at least two regions adjacent to each other, among the first region, the second region, and the third region, via the element isolation region,
wherein a plurality of external terminals including the first external terminal, the second external terminal, and the third external terminal, to which P different power supply voltages (P is an integer equal to or more than 3) are respectively supplied, are provided above the semiconductor substrate,
N regions including the first region, the second region, and the third region are formed in the well, where N=P(P−1)/2,
one protection circuit is provided in each of the N regions, and
the guard ring surrounds the entire of the N regions via the element isolation region.

2. The semiconductor integrated circuit of claim 1, wherein the first region, the second region, and the third region are electrically isolated individually with the element isolation region, and
the guard ring surrounds the entire of at least the first region, the second region, and the third region via the element isolation region.

3. The semiconductor integrated circuit of claim 1, wherein the first region and the second region overlap each other, and the second region and the third region overlap each other,
- the second impurity diffusion region and the third impurity diffusion region share a same region constituting an overlap portion of the first region and the second region,
- the fourth impurity diffusion region and the fifth impurity diffusion region share a same region constituting an overlap portion of the second region and the third region, and
- the guard ring surrounds the entire of the first region, the second region, and the third region.

4. The semiconductor integrated circuit of claim 1, wherein the first region, the second region, and the third region are electrically isolated individually with the element isolation region, and
- the guard ring surrounds the entire of the first region, the second region, and the third region via the element isolation region, and is also formed continuously in portions of the well located between the first region and the second region and between the second region and the third region.

5. The semiconductor integrated circuit of claim 1, wherein power supply voltages different from one another are supplied to the first external terminal, the second external terminal, and the third external terminal,
- the first protection circuit is constructed of a first N-channel MOS transistor having the first impurity diffusion region, the second impurity diffusion region, and a first gate electrode formed on a portion of the semiconductor substrate sandwiched between the first impurity diffusion region and the second impurity diffusion region,
- the second protection circuit is constructed of a second N-channel MOS transistor having the third impurity diffusion region, the fourth impurity diffusion region, and a second gate electrode formed on a portion of the semiconductor substrate sandwiched between the third impurity diffusion region and the fourth impurity diffusion region,
- the third protection circuit is constructed of a third N-channel MOS transistor having the fifth impurity diffusion region, the sixth impurity diffusion region, and a third gate electrode formed on a portion of the semiconductor substrate sandwiched between the fifth impurity diffusion region and the sixth impurity diffusion region, and
- the first gate electrode, the second gate electrode, and the third gate electrode are connected to an external terminal, among the first external terminal, the second external terminal, and the third external terminal, to which the lowest voltage is supplied.

6. The semiconductor integrated circuit of claim 1, wherein power supply voltages different from one another are supplied to the first external terminal, the second external terminal, and the third external terminal,
- the first protection circuit is constructed of a first P-channel MOS transistor having the first impurity diffusion region, the second impurity diffusion region, and a first gate electrode formed on a portion of the semiconductor substrate sandwiched between the first impurity diffusion region and the second impurity diffusion region,
- the second protection circuit is constructed of a second P-channel MOS transistor having the third impurity diffusion region, the fourth impurity diffusion region, and a second gate electrode formed on a portion of the semiconductor substrate sandwiched between the third impurity diffusion region and the fourth impurity diffusion region,
- the third protection circuit is constructed of a third P-channel MOS transistor having the fifth impurity diffusion region, the sixth impurity diffusion region, and a third gate electrode formed on a portion of the semiconductor substrate sandwiched between the fifth impurity diffusion region and the sixth impurity diffusion region, and
- the first gate electrode, the second gate electrode, and the third gate electrode are connected to an external terminal, among the first external terminal, the second external terminal, and the third external terminal, to which the highest voltage is supplied.

7. The semiconductor integrated circuit of claim 5, further comprising a resistance provided on a path between each of the first gate electrode, the second gate electrode, and the third gate electrode and the external terminal connected to the first gate electrode, the second gate electrode, and the third gate electrode.

\* \* \* \* \*